US009609449B1

(12) United States Patent
Mäenpää

(10) Patent No.: US 9,609,449 B1
(45) Date of Patent: Mar. 28, 2017

(54) CONTINUOUS SOUND PRESSURE LEVEL MONITORING

(71) Applicant: Microsoft Technology Licensing, LLC, Redmond, WA (US)

(72) Inventor: Ossi Mäenpää, Salo (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/922,281

(22) Filed: Oct. 26, 2015

(51) Int. Cl.
*H04R 29/00* (2006.01)
*G01D 1/18* (2006.01)
*G01H 11/06* (2006.01)
*G06F 3/16* (2006.01)

(52) U.S. Cl.
CPC .............. *H04R 29/001* (2013.01); *G01D 1/18* (2013.01); *G01H 11/06* (2013.01); *G06F 3/162* (2013.01)

(58) Field of Classification Search
CPC ........ H04R 29/001; G01D 1/18; G01H 11/06; G06F 3/162
See application file for complete search history.

(56) References Cited

U.S. PATENT DOCUMENTS

| 6,456,199 | B1 | 9/2002 | Michael | |
| 6,826,515 | B2* | 11/2004 | Bernardi | G01H 3/14 |
| | | | | 379/387.01 |
| 7,529,377 | B2 | 5/2009 | Nackvi et al. | |
| 7,813,520 | B2* | 10/2010 | Von Dach | H04R 25/453 |
| | | | | 381/104 |
| 7,983,426 | B2* | 7/2011 | Schuler | G01H 3/14 |
| | | | | 340/540 |
| 8,213,629 | B2* | 7/2012 | Goldstein | H04R 1/1041 |
| | | | | 381/107 |
| 8,278,543 | B2 | 10/2012 | Humphrey | |
| 8,311,228 | B2 | 11/2012 | Goldstein et al. | |
| 8,488,799 | B2 | 7/2013 | Goldstein et al. | |
| 8,737,630 | B2* | 5/2014 | Chang | G01H 3/14 |
| | | | | 381/56 |
| 8,774,433 | B2* | 7/2014 | Goldstein | H04R 1/1016 |
| | | | | 381/317 |
| 8,958,577 | B2 | 2/2015 | Carey | |
| 2005/0069153 | A1 | 3/2005 | Hall et al. | |
| 2005/0254667 | A1 | 11/2005 | Michael | |
| 2007/0274531 | A1* | 11/2007 | Camp | H04R 5/04 |
| | | | | 381/74 |
| 2008/0181442 | A1 | 7/2008 | Goldstein et al. | |
| 2009/0085873 | A1* | 4/2009 | Betts | G08B 13/1427 |
| | | | | 345/169 |

(Continued)

OTHER PUBLICATIONS

"Audio Kit", Published on: Mar. 21, 2015 Available at: http://store.sinusoid.com/software/iphone-apps/audio-kit.html.

(Continued)

*Primary Examiner* — Brenda Bernardi

(57) ABSTRACT

A device is disclosed, the device comprising a least one microphone, at least one output audio transducer driver, at least one processor, a storage comprising a set of instructions executed locally, wherein the set of instructions causes the processor to: continuously measure an ambient sound pressure level when the device is an on state, calculate a sound pressure level of the output audio transducer driver when the output audio transducer is active, combine the two sound pressure levels into a total sound pressure level.

20 Claims, 5 Drawing Sheets

(56) References Cited

U.S. PATENT DOCUMENTS

| | | | |
|---|---|---|---|
| 2009/0208024 A1* | 8/2009 | Farver | G01H 3/14 381/56 |
| 2009/0245537 A1* | 10/2009 | Morin | H03G 3/3005 381/107 |
| 2009/0315708 A1 | 12/2009 | Walley et al. | |
| 2010/0046767 A1 | 2/2010 | Bayley et al. | |
| 2010/0135502 A1* | 6/2010 | Keady | A61B 5/121 381/58 |
| 2010/0278350 A1* | 11/2010 | Rung | G01H 3/14 381/59 |
| 2014/0294191 A1* | 10/2014 | Parkins | A61F 11/06 381/72 |

OTHER PUBLICATIONS

"Sound Meter: SPL Calculator", Jun. 30, 2015 Available at: https://play.google.com/store/apps/details?id=com.decibal.soundmeter&hl=en.

* cited by examiner

CONTINUOUS SOUND PRESSURE LEVEL MONITORING

BACKGROUND

Noise exposure may lead to a hearing damage. A person may be exposed to various sources of noise. These may include occupational sources like heavy machinery, recreational sources like music systems or general ambient noise sources like vehicles etc. Another common source of sound and/or noise exposure may be headphones used for listening to music or for making calls. Headphones may be more invasive as they produce sound near or in inside the ear canal. A commonly used indicator of sound strength is sound pressure level. Not only exposure to high sound pressure levels but also long term and/or extended exposure to average or above average sound pressure levels may be harmful to human hearing. Listening to music on earphones/headphones and/or being exposed to ambient noise even at average/medium sound pressure levels over extended periods of time may cause hearing loss. Users may use mobile devices to listen to music. Such mobile devices may incorporate at least one microphone. Due to the risk that using headphones over extended periods of time may cause hearing loss, regulatory bodies have put out or are in the process of putting out regulations that mandate device manufacturers to include capabilities to measure output sound pressure levels. These regulations include upcoming European Union standard EN50332-3, which mandates monitoring of music playback sound pressure level.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

A device comprising a microphone and an audio output transducer driver is described. In an embodiment, a device is disclosed, the device comprising at least one microphone, at least one output audio transducer driver, at least one processor, a storage comprising a set of instructions executed locally. The set of instructions causes the processor to continuously measure an ambient sound pressure level using the at least one microphone whenever the device is in an on state, calculate a sound pressure level of the output audio transducer driver when the output audio transducer is active, and combine the two sound pressure levels into a total sound pressure level.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

Like references are used to designate like parts in the accompanying drawings.

DETAILED DESCRIPTION

The detailed description provided below in connection with the appended drawings is intended as a description of the embodiments and is not intended to represent the only forms in which the embodiment may be constructed or utilized. However, the same or equivalent functions and structures may be accomplished by different embodiments.

Although the embodiments may be described and illustrated herein as being implemented in a mobile phone such as a smartphone, this is only an embodiment of the disclosed specifications and not a limitation. As those skilled in the art will appreciate, the present embodiments are suitable for application in a variety of different types of devices; which have processing capability, can execute instructions and comprise a microphone and an audio output transducer driver. These include portable media players, tablet computers, wearable gadgets, mobile phones, portable game consoles, personal digital assistants etc.

Most people carry a mobile device with them. Mobile devices may comprise software such as operating system, application software or firmware or a combination thereof. Such software may execute locally to provide various functionalities. One popular functionality may be a digital assistant, which may be voice activated. Such digital assistants may be active all the time the device is powered on. Some components, hardware and software, of the device may therefore be active as long as the device is powered on. For voice based commands a microphone may be always active to listen to any possible commands.

Figure 1:
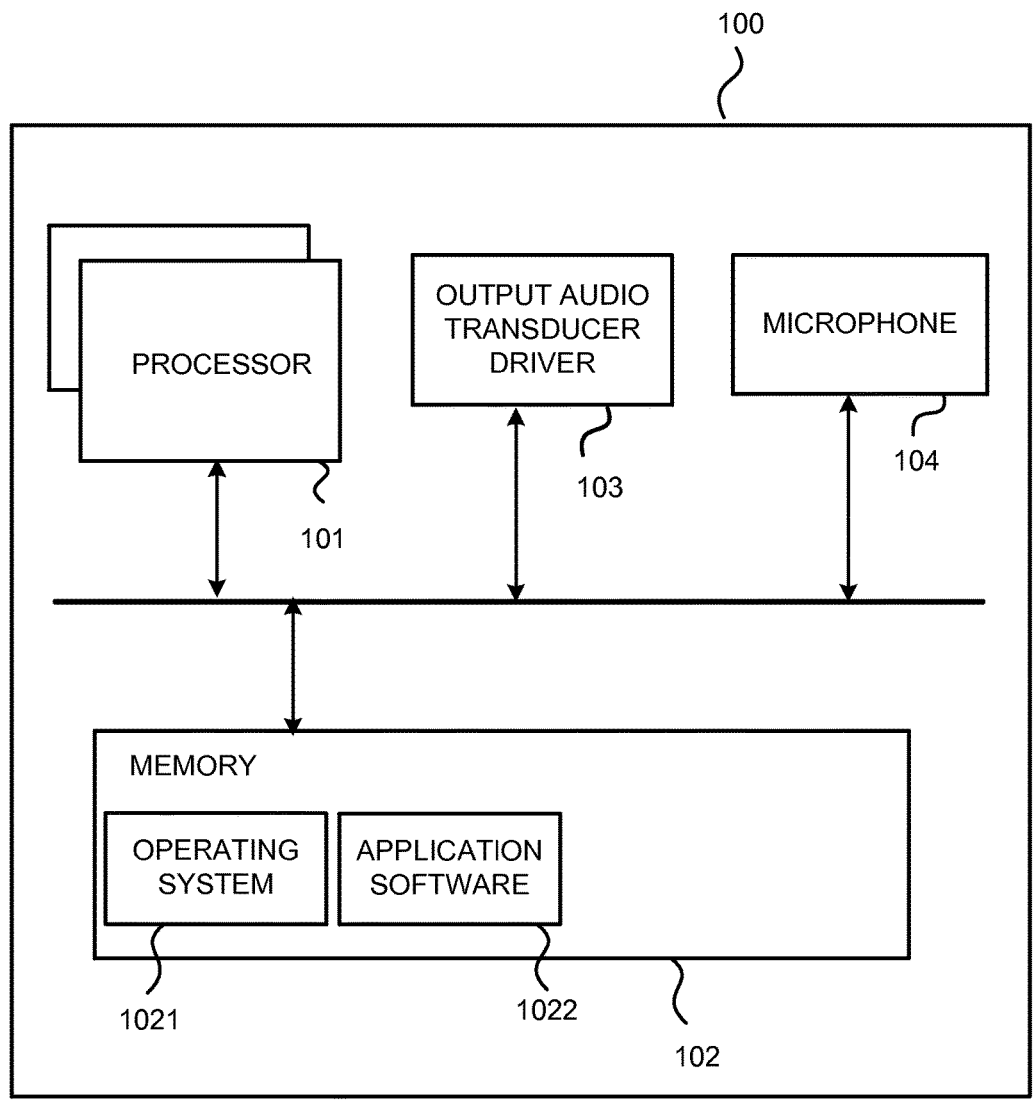
FIG. 1 illustrates a schematic representation of a mobile device comprising an output audio transducer driver, a microphone, a processor and a memory according to an embodiment.

FIG. 1 illustrates a device 100 as a functional block diagram according to an embodiment. The device 100 comprises a processor 101, a memory 102, an output audio transducer driver 103, and a microphone 104. The processor 101 may be a single core or a multi core processor. According to an embodiment, the device 100 may comprise more than one processor. The memory 102 comprises an instruction set. According to an embodiment, the instruction set may comprise an operating system 1021 and application software 1022. According to another embodiment, the instruction set may comprise firmware (not illustrated in FIG. 1).

Referring to FIG. 1, processor 101, memory 102, output audio transducer driver and the microphone may be in one way or two way communication with each other. The output audio transducer driver 103 may be configured to drive an audio output transducer (not illustrated in FIG. 1). It may have a port or a jack for an output audio transducer. The audio output transducer may be, for example, an earphone, a headphone, a headset etc. The output audio transducer driver 103 may be configured to output electrical signals, corresponding to desired audio signals, to the output audio transducer which may play the desired audio. The content and the power of the output of the output audio transducer driver 103 may be controllable by the processor 103. The microphone 104 may be configured to convert audio signals into corresponding electrical signals. Parameters like sensitivity, efficiency etc. of microphone 104, output audio transducer driver 103, and output audio transducer may be known to processor 101. The parameters may be stored, for example, in memory 102.

Referring to FIG. 1, an instruction set may cause the processor 101 to function as described herein according to an embodiment. Processor 101 may continuously receive information corresponding to audio received by the microphone 104. Processor 101 may calculate a sound pressure level (SPL) from the received signals. The SPL so measured, herein after referred to as ambient SPL, may represent SPL of ambient noise. Processor 101 may continuously measure and store the ambient SPL. Storing the ambient SPL, for example in memory 102, may include storing the corresponding time data like a time stamp or a measure/period of time for each value of ambient SPL so calculated. When the output audio transducer driver 103 is active, the processor 101 may calculate SPL of the audio output by the output audio transducer connected to the output audio transducer driver. This may be affected by using the power output by the output audio transducer driver 103. The processor may know the power output by the output audio transducer driver 103; and may calculate the output SPL by using the already known values of parameters like sensitivity of the output audio transducer. The SPL of output transducer so calculated may be hereinafter referred to as output SPL.

Processor 101 may combine the ambient SPL and output SPL in a continuous manner and monitor it. Monitoring the combined SPL may include comparing it to a threshold. If the combined SPL passes the threshold, the processor may notify the user. The notification may an audio notification output through the output audio transducer or a visual notification output through a light emitting diode (not illustrated in FIG. 1) or through a graphical user interface (GUI) on a display (not illustrated in FIG. 1). Further the processor may keep track of a cumulative SPL and calculate an ear stress level based on the cumulative SPL and time of exposure. Time of exposure may be the time from start of measurement. The processor may continuously compare ear stress level to a threshold. The threshold for ear stress level may be one that is deemed safe by regulatory bodies, scientific community or it may be set by the user. Further the processor 101 may continuously calculate a recovery time based on the ear stress level. Once the ear stress level crosses the threshold, the processor may notify the user. The notification may include one or more of: a warning, a recommended recovery time, an ear stress level, a recommended activity, history of ambient or output audio transducer SPL, and recent peaks and/or troughs in SPL. The notification may be output as an audio message, or through a GUI or a natural user interface (NUI).

According to an embodiment, the device may comprise a display screen for a GUI. According to an embodiment, the display screen may be touch and/or force sensitive. The display screen may display information like a warning, a recommended recovery time, an ear stress level, a recommended activity, history of ambient or output audio transducer SPL, and recent peaks and/or troughs in SPL. The notification may be output as an audio message, or through a GUI or a natural user interface (NUI).

According to an embodiment, ear stress level may be computed as a function of cumulative SPL since the last time ear stress level was zero or close to the zero or a small value and the natural ability of human ear to recover from stress. According to an embodiment, the natural recovery ability of the ear may be modelled mathematically as a model comprising a constant, an equation, a set of constants, or a set of equations. According to an embodiment, the model may be stored in the device 100 or the device 100 may learn from inputs from the user. Periods of low combined SPL may result in lower ear stress while as periods of higher SPL may increase the ear stress level. Periods of silence or substantial silence may result in decrease in ear stress.

According to an embodiment, warning a user of high ear stress level may prevent hearing damage. According to another embodiment, recommending a recovery time may effectuate an informed decision from the user of a device. The user may be encouraged to ameliorate their ear stress level. Amelioration of high ear stress level may be achieved by turning of output audio transducer and/or moving to an acoustically quieter location. According to an embodiment, warning a user of possible hearing damage due to peaks in combined SPL or due to high ear stress level may fulfill regulatory requirements and provide additional information to a user beyond the regulatory requirements.

Figure 2:
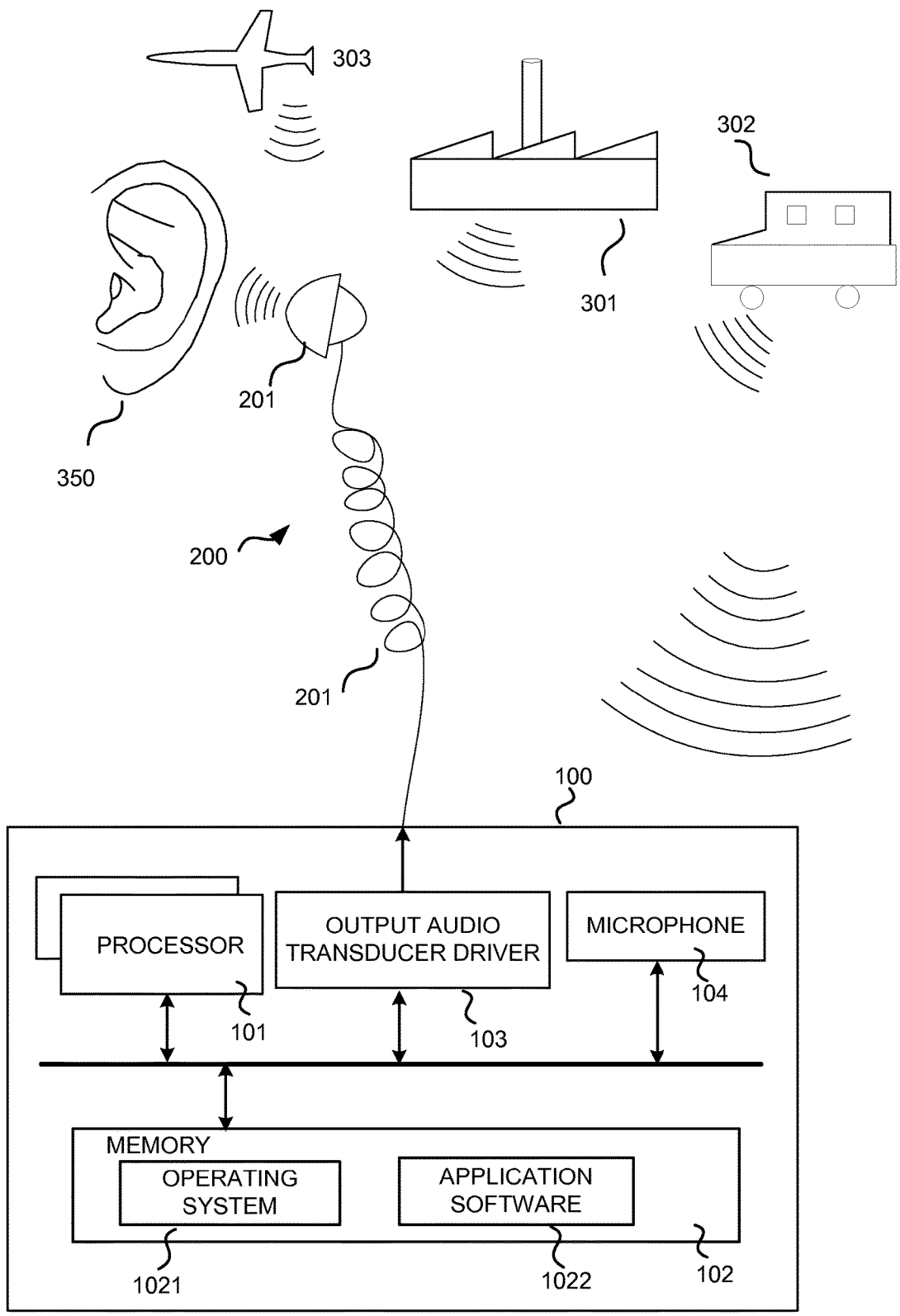
FIG. 2 illustrates a schematic representation of a mobile device, an earphone connected to an output audio transducer driver, some representative sound waves and a human ear according to an embodiment.

FIG. 2 illustrates some representative sources of noise a human ear 350 may be exposed to, according to an embodiment. The ambient noise a human ear 350 is exposed to, may come from various sources like cars 302, heavy machinery in factories 301, means of transportation like railways (not illustrated in FIG. 2), airplanes 303, domestic appliances and machines like (not illustrated in FIG. 2) lawn movers, food processors etc. Further a user's ear may be exposed to audio from an earpiece 200 connected to a device 100. The earpiece 200 may comprise a cable 201 to connect to the output audio transducer driver 103. In an embodiment, the earpiece may be connected wirelessly to the device 100. The earpiece 200 may further comprise a portion, for example earbuds 201, to produce and direct audio into human ear 350. The various noise and audio signals are illustrated as unreferenced propagating wave fronts in FIG. 2. The microphone 104 may detect and convert audio from all sources including 303, 301, and 302 except from the earpiece 200. The processor 101 may continuously calculate ambient SPL from the transduced audio from the microphone 104. Concurrently the processor 101 may monitor the output power values of output audio transducer 103 and calculate an output transducer SPL. The processor may combine the ambient SPL and output SPL to calculate a combined SPL that the human ear 350 is exposed to. Further the processor may calculate ear stress level of the user and notify and/or give information and/or recommendations as described in the embodiment illustrated in FIG. 1.

According to an embodiment, the microphone 104 may be external to the device 100. According to an embodiment, the microphone 104 and the output audio transducer 200 may be connected to the device 100 through the same port or jack.

According to an embodiment, an external microphone (not illustrated in FIG. 2) may be attached to the device 100 in addition to an internal microphone. According to an embodiment, the external microphone and the output audio transducer 200 may be connected to the device 100 through the same port or jack. According to an embodiment, the external microphone may be comprised in a wearable device in communication with the device 100 (not illustrated in FIG. 2). According to an embodiment, whenever an external microphone is connected to the device 100, the external microphone may be used to calculate SPL of ambient noise. According to an embodiment, using a microphone external to the device may provide more accurate measurements of ambient SPL as the device 100 may be so disposed as to make measurements of ambient SPL using an internal microphone inaccurate, for example, the device may be in a user's pocket. According to an embodiment, device 100 may comprise various sensors like proximity sensors, image sensors. According to an embodiment, the device 100 may use sensors to detect if the device 100 is in a pocket or a bag or otherwise covered; if so, the device 100 may use a connected external microphone to measure ambient SPL.

According to an embodiment, if parameters like sensitivity of an output transducer 200 are not known to the processor 101, the processor 101 may fetch the sensitivity of the transducer 200 over a network after asking identifying information of the transducer 200 from the user. According to an embodiment, the processor 101 may learn the parameters of the output transducer 200 from the user. According to an embodiment, the sensitivity of the transducer 200 may be calculated by the processor 101. The processor 101 may ask the user to dispose the transducer 200 near the microphone 104 and cause the output audio transducer driver 103 to output a test signal at a known power level. The processor 101 may then calculate an SPL using the microphone 104. This measured SPL and the output power may be used to calculate a sensitivity of the transducer 200. According to an embodiment, the processor 101 may subtract an average of ambient SPL before and after the test, from the SPL measured with the microphone 104 to get a more accurate value of SPL produced by the transducer 200 and hence a more accurate value of sensitivity of transducer 200.

Figure 3:
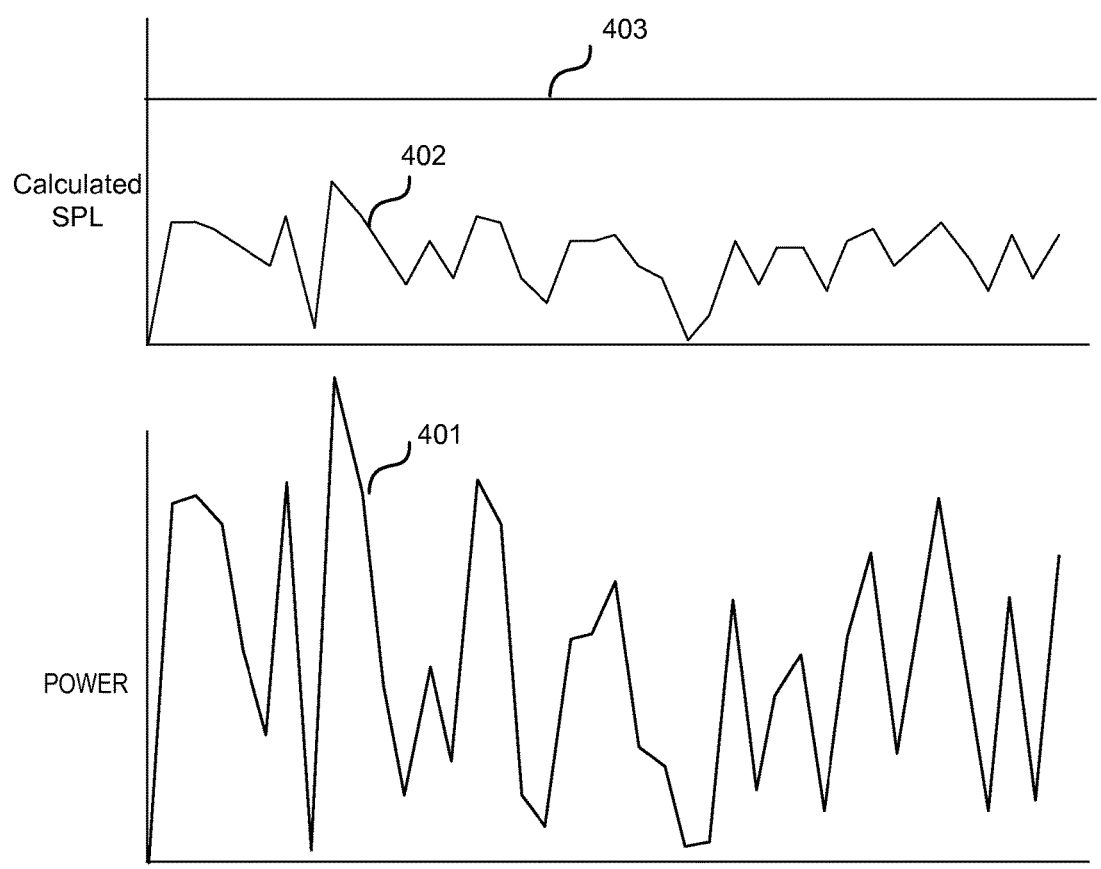
FIG. 3 illustrates a graphical representation of an output power of the output audio transducer driver and a corresponding calculated sound pressure level according to an embodiment.

FIG. 3 illustrates, as a graphical representation, the relationship between output power of the output audio transducer driver 103 and the calculated output SPL 402 with respect to time. The vertical axis is that of magnitude on different scales and the horizontal axis that of time. The output SPL 402 and output audio transducer power 401 may have a mutually logarithmic relationship with each other, involving sensitivity of the output audio transducer and a reference distance. According to an embodiment the following formula may be used for calculation of output SPL 402:

Output SPL=10×log(output power divided by reference power)+sensitivity

Referring to FIG. 3, 401 illustrates the variation of output power of the output audio transducer according to an embodiment. 402 illustrates the corresponding calculated SPL. The processor 101 may affect a threshold 403 so that if the calculated output SPL 402 exceeds, the user may be warned and/or notified. According to an embodiment, the processor may adjust the power output of output audio transducer 103 when the calculated SPL breaches the threshold 403.

Figure 4:
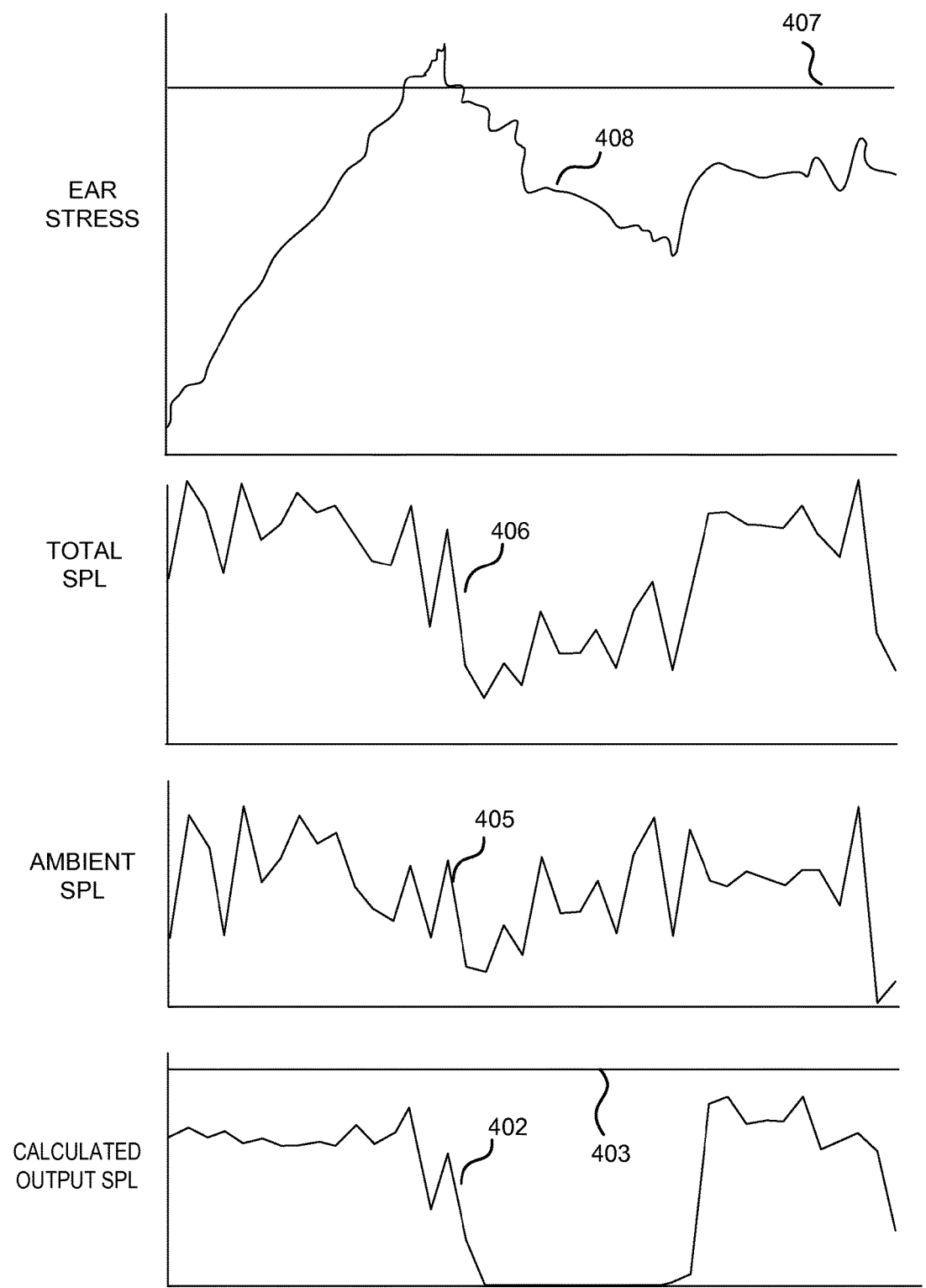
FIG. 4 illustrates a graphical representation of the calculated sound pressure level of an output audio transducer, ambient sound pressure level, total sound pressure levels and an ear stress level.

FIG. 4 illustrates, as a graphical representation, calculated output SPL 402, ambient SPL 405, total SPL 406, and corresponding ear stress level 408 on the same time scale but different magnitude scales for a representative time period, according to an embodiment. Total SPL 406 at any instant is the sum of calculated output SPL 402 and ambient SPL 405 at that point of time. An ear stress level 408 may be calculated based on current and past SPLs. The calculation may take into consideration the different ear stress impact of exposure to ambient noise and deliberate listening to music and other audio. This may be affected by assigning different weights to ambient SPL 405 and calculated output SPL 402 when calculating ear stress 408. The processor 101 may compare calculated ear stress level 408 to a threshold level 407. This may be done in addition to comparing the calculated output SPL 402 with a threshold output SPL level 403. In case any of the thresholds 403 or 408 is passed, the user may be notified.

According to an embodiment, when the ear stress level 408 is greater than a threshold 407, a user may be notified. The notification may include an alerting component and an information component. The alerting component may comprise vibration of device 100, an LED pulsing light, an audio tone etc. The information component may comprise at least two of: a recommended recovery time, a measure of ear stress level, a history of total SPL, a history of calculated SPL, a history of ambient SPL, current total SPL, current ambient SPL, current calculated output SPL, and a recommended activity. According to an embodiment, when the calculated output SPL 402 passes a threshold 403, the user may be notified and the power of the output audio transducer 103 may be reduced to reduce the output calculated SPL. According to an embodiment, the notification may include an indication that calculated output SPL is outside healthy levels. Further the warning may include some or all of: a recommended recovery time, a measure of ear stress level, a history of total SPL, a history of calculated SPL, a history of ambient SPL, current total SPL, current ambient SPL, current calculated output SPL, and a recommended activity.

According to an embodiment, the information in a notification may be presented to the user as a machine generated audio, visually in a GUI, via an NUI, or a combination thereof.

According to an embodiment, some or all of the following may be accessed by a user, by querying the processor 101, at any time irrespective of whether a threshold has been passed: a recommended recovery time, a measure of ear stress level, a history of total SPL, a history of calculated SPL, a history of ambient SPL, current total SPL, current ambient SPL, current calculated output SPL, and a recommended activity.

It should be noted that the graphical representations shown in FIG. 3 and FIG. 4 are for illustrative purposes only and not intended as a limitation. The measured data may not and need not conform to graphical shapes illustrated herein.

It should be noted that the output audio transducer 200 may be any audio transducer configured to be disposed in or near the ear. Such devices may be referred to by various includes earphones, earpieces, headphones, headsets etc.

Figure 5:
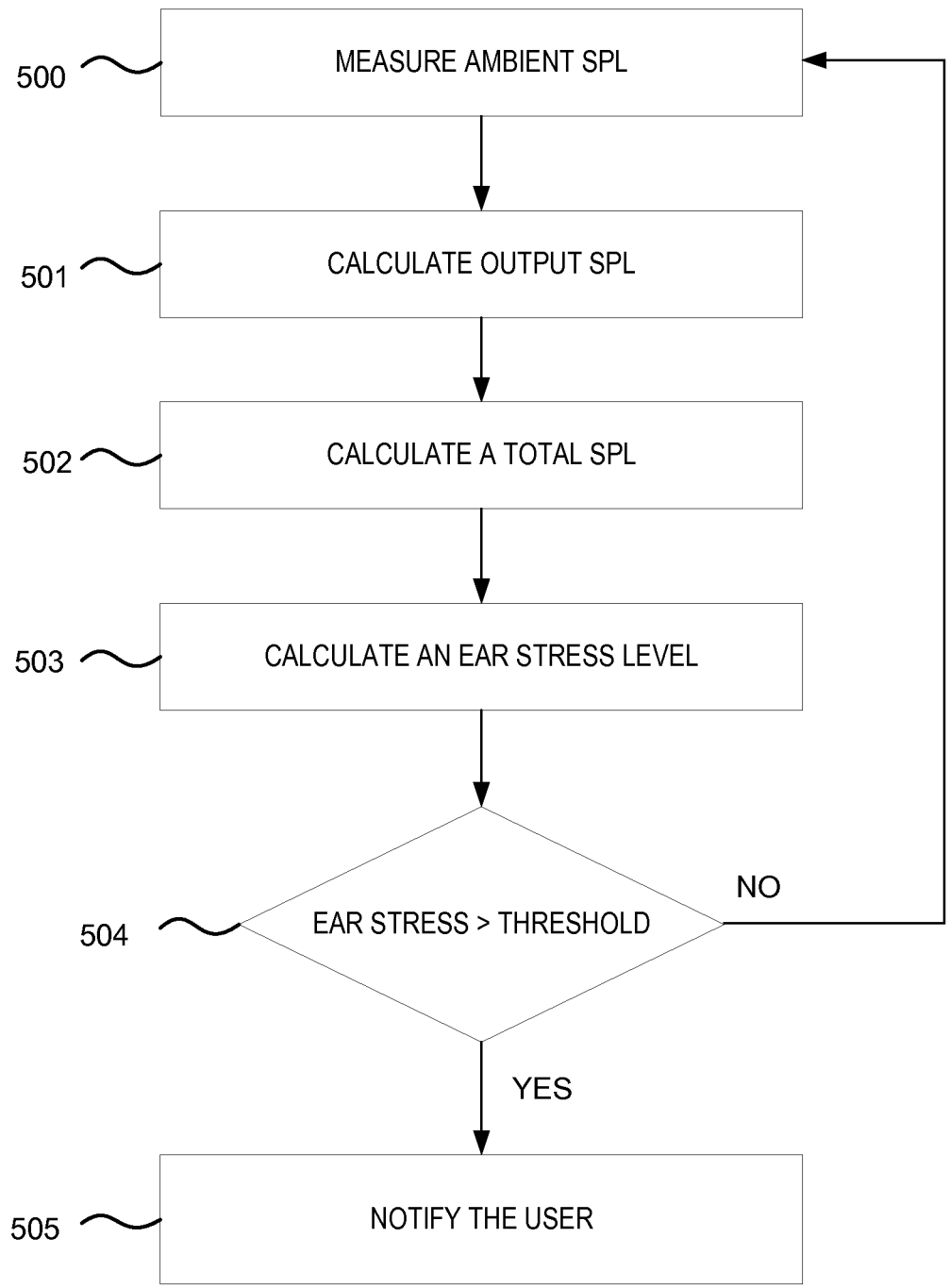
FIG. 5 illustrates a schematic flow chart of a method of monitoring sound pressure levels and reporting statistics in accordance with an embodiment.

FIG. 5 illustrates, as a schematic flow chart, a method of monitoring SPL in accordance with an embodiment. Referring to FIG. 5, according to an embodiment the process may comprise steps 500, 501, 502, 503, 504, and 505.

In step 500 ambient SPL may be measured continuously. Step 501 may include calculating an output SPL by a transducer, which may be worn by a user. An output SPL may be calculated whenever the output transducer is active. In step 502, a total SPL combining the calculated output SPL and the ambient SPL may calculated. An ear stress level based on the current total SPL and SPL history may be calculated in step 503. In step 504, the ear stress level so obtained may be compared with a threshold. The threshold may be based upon safe ear stress levels or a user's comfort history or a user choice. If the ear stress level is less than a threshold, the process monitoring may continue. If the ear stress is greater than a threshold a user may be notified. According to an embodiment, the notifying the user may include at least two of: recommending a recovery time, providing a measure of ear stress level, providing a history of total SPL, providing a history of calculated SPL, providing a history of ambient SPL, providing current total SPL, providing current ambient SPL, providing current calculated output SPL, a peak level of the combined SPL, and recommending an activity.

According to an embodiment, the process of FIG. 5 may be compiled into the program code either in operating system 1021 or as application software 1022 or as firmware or as a combination thereof.

The methods and functionalities described herein may be performed by software in machine readable form on a tangible storage medium e.g. in the form of a computer program comprising computer program code means adapted to perform all the functions and the steps of any of the methods described herein when the program is run on a computer and where the computer program may be embodied on a computer readable medium. Examples of tangible storage media include computer storage devices comprising computer-readable media such as disks, thumb drives, memory etc. and do not include propagated signals. Propagated signals may be present in tangible storage media, but propagated signals per se are not examples of tangible storage media. The software can be suitable for execution on a parallel processor or a serial processor such that the method steps may be carried out in any suitable order, or simultaneously.

This acknowledges that software can be a valuable, separately tradable commodity. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

Alternatively, or in addition, the functionally described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Any range or device value given herein may be extended or altered without losing the effect sought. Also any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

In accordance with an embodiment, a device, comprising: a microphone; an output audio transducer driver; a processor; a local storage comprising a set of instructions for a local execution by the processor; wherein the set of instructions causes the processor to: continuously measure an ambient sound pressure level using the microphone whenever the device is in an on state; calculate a sound pressure level of an output audio transducer driven by the output audio transducer driver when the output audio transducer is active, based on a power of the output audio transducer driver and characteristics of the output audio transducer; and combine the two sound pressure levels into a total sound pressure level.

Alternatively or in addition to, the instructions further cause the processor to calculate an ear stress level based on the total sound pressure level and time of exposure.

Alternatively or in addition to, if the ear stress level is greater than a threshold, the user is notified by a notification.

Alternatively or in addition to, further including a user interface, comprising information about: a measure of accumulated sound pressure level dosage; a recommended recovery time; an ear stress level; a history of ambient sound pressure levels; a history of audio output transducer sound pressure levels; a history of total sound pressure levels; a peak level of the combined sound pressure levels; and a history of ear stress levels.

Alternatively or in addition to, the user is notified if the calculated output audio transducer sound pressure level or calculated output audio transducer sound pressure level dosage passes a threshold.

Alternatively or in addition to, the user is notified if the ambient sound pressure level or ambient sound pressure level dosage passes a threshold.

Alternatively or in addition to, the notification includes at least one of: a measure of accumulated sound pressure level dosage; a recommended recovery time; an ear stress level; a history of ambient sound pressure levels; a history of audio output transducer sound pressure levels; a history of total sound pressure levels; a peak level of the combined sound pressure levels; and a history of ear stress levels.

Alternatively or in addition to, the instructions further cause the processor to adjust the power of the output audio transducer driver to keep the calculated output audio transducer sound pressure level below a threshold.

Alternatively or in addition to, the notification further includes an audio component.

Alternatively or in addition to, the audio component includes an audio beep or a human language warning message.

Alternatively or in addition to, the output audio transducer sound pressure level is calculated from power levels of the output audio transducer driver and a sensitivity of the output audio transducer.

Alternatively or in addition to, the sensitivity of an output audio transducer whose sensitivity is not known is either input by the user or fetched over a network.

Alternatively or in addition to, the instructions cause the processor to calculate a sensitivity of a new output audio transducer, the calculation including: asking a user to dispose the new output audio transducer close to the microphone; calculating an output sound pressure level of the output audio transducer from the audio received by the microphone; subtracting an average sound pressure level from the measured output sound pressure level; and calculating a sensitivity of the output transducer from the measured output sound pressure level and the power of the audio output transducer driver.

According to an embodiment, a mobile device, comprising: at least one microphone; at least one earphone driver; at least one processor; a storage comprising a set of instructions; wherein the set of instructions causes the processor to: continuously measure an ambient sound pressure level using the at least one microphone; calculate a sound pressure level of an earphone when the earphone is active; combine the two sound pressure levels into a total sound pressure level; calculate an ear stress level based on the total sound pressure level and time of exposure; notify a user if the ear stress level is greater than a threshold; wherein the notification includes at least two of: a measure of accumulated sound pressure level dosage; a recommended recovery time; and the ear stress level.

Alternatively or in addition to, the notification further comprises at least one of: a history of ambient sound pressure levels; a history of audio output transducer sound pressure levels; a history of total sound pressure levels; a peak level of the combined sound pressure levels; and a history of ear stress levels.

Alternatively or in addition to, further including accessing, by the user, through a graphical user interface or a natural user interface, at least one of: the measure of accumulated sound pressure level dosage; the recommended recovery time; the ear stress level; a history of ambient sound pressure levels; a history of audio output transducer sound pressure levels; a history of total sound pressure levels; a peak level of the combined sound pressure levels; and a history of ear stress levels.

According to an embodiment, a method for locally implementing in a device, the method comprising: measuring an ambient sound pressure level using a microphone of the device when the device is in an on state; calculating an output audio sound pressure level based on an output power and characteristics of an output transducer; and combining the two sound pressure levels into a total sound pressure level.

Alternatively or in addition to, further comprising calculating an ear stress level based on the total sound pressure level and time of exposure.

Alternatively or in addition to, further comprising: comparing the total sound pressure level to a threshold sound pressure level; comparing the ear stress level to a threshold ear stress level; and notifying a user if a threshold is passed.

Alternatively or in addition to, further comprising, making available to a user, information comprising at least one of: a measure of accumulated sound pressure level dosage; a recommended recovery time; an ear stress level; a history of ambient sound pressure levels; a history of audio output transducer sound pressure levels; a history of total sound pressure levels; a peak level of the combined sound pressure levels; and a history of ear stress levels.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The steps of the methods described herein may be carried out in any suitable order, or simultaneously where appropriate. Additionally, individual blocks may be deleted or combined with other blocks from any of the methods without departing from the spirit and scope of the subject matter described herein. Aspects of any of the embodiments described above may be combined with aspects of any of the other embodiments described to form further embodiments without losing the effect sought.

The term 'comprising' is used herein to mean including the method, blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A device, comprising:
   a microphone;
   an output audio transducer driver;
   a processor; and
   a local storage comprising a set of instructions for a local execution by the processor;
   wherein the set of instructions causes the processor to:
   measure an ambient sound pressure level using the microphone whenever the device is in an on state;
   calculate a sound pressure level of an output audio transducer driven by the output audio transducer driver when the output audio transducer is active, based on a power of the output audio transducer driver and characteristics of the output audio transducer;
   and combine the two sound pressure levels into a total sound pressure level.

2. The device of claim 1, wherein the instructions further cause the processor to calculate an ear stress level based on the total sound pressure level and time of exposure.

3. The device of claim 2, wherein if the ear stress level is greater than a threshold, the user is notified by a notification.

4. The device of claim 1, further including a user interface, comprising information about:
   a measure of accumulated sound pressure level dosage;
   a recommended recovery time;
   an ear stress level;
   a history of ambient sound pressure levels;
   a history of audio output transducer sound pressure levels;
   a history of total sound pressure levels;
   a peak level of the combined sound pressure levels;
   and a history of ear stress levels.

5. The device of claim 1, wherein the user is notified if the calculated output audio transducer sound pressure level or a calculated output audio transducer sound pressure level dosage passes a threshold.

6. The device of claim 1, wherein the user is notified if the ambient sound pressure level or a calculated output audio transducer sound pressure level dosage passes a threshold.

7. The device of claim 3, wherein the notification includes at least one of:
   a measure of accumulated sound pressure level dosage;
   a recommended recovery time;
   an ear stress level;
   a history of ambient sound pressure levels;
   a history of audio output transducer sound pressure levels;
   a history of total sound pressure levels;
   a peak level of the combined sound pressure levels;
   and a history of ear stress levels.

8. The device of claim 1, wherein the instructions further cause the processor to adjust the power of the output audio transducer driver to keep the calculated output audio transducer sound pressure level below a threshold.

9. The device of claim 3, wherein the notification further includes an audio component.

10. The device of claim 9, wherein the audio component includes an audio beep or a human language warning message.

11. The device of claim 1, wherein the output audio transducer sound pressure level is calculated from power levels of the output audio transducer driver and a sensitivity of the output audio transducer.

12. The device of claim 11, wherein the sensitivity of an output audio transducer whose sensitivity is not known is either input by the user or fetched over a network.

13. The device of claim 11, wherein the instructions cause the processor to calculate a sensitivity of a new output audio transducer, the calculation including:
    asking a user to dispose the new output audio transducer close to the microphone;
    calculating an output sound pressure level of the output audio transducer from the audio received by the microphone;
    subtracting an average sound pressure level from the measured output sound pressure level; and
    calculating a sensitivity of the output transducer from the measured output sound pressure level and the power of the audio output transducer driver.

14. A mobile device, comprising:
    at least one microphone;
    at least one earphone driver;
    at least one processor; and
    a storage comprising a set of instructions;
    wherein the set of instructions causes the processor to:
    measure an ambient sound pressure level using the at least one microphone;
    calculate a sound pressure level of an earphone when the earphone is active;
    combine the two sound pressure levels into a total sound pressure level;
    calculate an ear stress level based on the total sound pressure level and time of exposure;
    notify a user if the ear stress level is greater than a threshold;
    wherein the notification includes at least two of:
        a measure of accumulated sound pressure level dosage;
        a recommended recovery time;
        and the ear stress level.

15. The device of claim 14, wherein the notification further comprises at least one of:
    a history of ambient sound pressure levels;
    a history of audio output transducer sound pressure levels;
    a history of total sound pressure levels;
    a peak level of the combined sound pressure levels;
    and a history of ear stress levels.

16. The device of claim 14, further including accessing, by the user, through a graphical user interface or a natural user interface, at least one of:
    the measure of accumulated sound pressure level dosage;
    the recommended recovery time;
    the ear stress level;
    a history of ambient sound pressure levels;
    a history of audio output transducer sound pressure levels;
    a history of total sound pressure levels;
    a peak level of the combined sound pressure levels;
    and a history of ear stress levels.

17. A method for locally implementing in a device, the method comprising:
    measuring an ambient sound pressure level using a microphone of the device when the device is in an on state;
    calculating an output audio sound pressure level based on an output power and characteristics of an output transducer;
    and combining the two sound pressure levels into a total sound pressure level.

18. The method of claim 17, further comprising calculating an ear stress level based on the total sound pressure level and time of exposure.

19. The method of claim 18, further comprising:
    comparing the total sound pressure level to a threshold sound pressure level;
    comparing the ear stress level to a threshold ear stress level;
    and notifying a user if a threshold is passed.

20. The method of claim 18, further comprising, making available to a user, information comprising at least one of:
    a measure of accumulated sound pressure level dosage;
    a recommended recovery time;
    an ear stress level;
    a history of ambient sound pressure levels;
    a history of audio output transducer sound pressure levels;
    a history of total sound pressure levels;
    a peak level of the combined sound pressure levels;
    and a history of ear stress levels.

* * * * *